(12) United States Patent
Dekker et al.

(10) Patent No.: US 6,368,946 B1
(45) Date of Patent: *Apr. 9, 2002

(54) MANUFACTURE OF A SEMICONDUCTOR DEVICE WITH AN EPITAXIAL SEMICONDUCTOR ZONE

(75) Inventors: Ronald Dekker; Cornelis E. Timmering; Doede Terpstra; Wiebe B. De Boer, all of Eindhoven (NL)

(73) Assignee: U.S. Phillips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/822,747

(22) Filed: Mar. 24, 1997

(30) Foreign Application Priority Data

Mar. 29, 1996 (EP) .............................................. 96200861

(51) Int. Cl.$^7$ ............................................. H01L 21/265
(52) U.S. Cl. ........................ 438/488; 438/337; 438/366
(58) Field of Search .................................. 438/337, 309, 438/365, 366, 367, 368, 369, 481, 496, 488, 564, 269, 561, 341, FOR 249, 696, 739

(56) References Cited

U.S. PATENT DOCUMENTS

| 4,892,837 A | * | 1/1990 | Kudo | ............................ 438/365 |
| 4,996,581 A | * | 2/1991 | Hamasaki | ..................... 438/365 |
| 5,100,813 A | * | 3/1992 | Nihera | ......................... 438/365 |

(List continued on next page.)

FOREIGN PATENT DOCUMENTS

EP 0535350 A2 4/1993 ........... H01L/21/20

Primary Examiner—Savitri Mulpuri
(74) Attorney, Agent, or Firm—Russell Gross

(57) ABSTRACT

A method of manufacturing a semiconductor device with an epitaxial semiconductor zone, whereby

- a first layer of insulating material, a first layer of non-monocrystalline silicon, and a second layer of insulating material are provided in that order on a surface of a silicon wafer,
- a window with a steep wall is etched through the second layer of insulating material and the first layer of non-monocrystalline silicon,
- the wall of the window is provided with a protective layer,
- the first insulating layer is selectively etched away within the window and below an edge of the first layer of non-monocrystalline silicon adjoining the window such that both the edge of the first layer of non-monocrystalline silicon itself and the surface of the wafer become exposed within the window and below said edge,
- semiconductor material is selectively deposited such that the epitaxial semiconductor zone is formed on the exposed surface of the wafer, and an edge of polycrystalline semiconductor material connected to the epitaxial semiconductor zone is formed on the exposed edge of the first layer of non-monocrystalline silicon,
- an insulating spacer layer is provided on the proctective layer on the wall of the window, and
- a second layer of non-monocrystalline silicon is deposited. The provision of a top layer of a material on which non-monocrystalline semiconductor material will grow during the selective deposition of the semiconductor material, which top layer is provided on the second layer of insulating material before the selective deposition of the semiconductor material, achieves that the selective deposition process can be better monitored.

1 Claim, 3 Drawing Sheets

U.S. PATENT DOCUMENTS

| | | | | |
|---|---|---|---|---|
| 5,147,810 A | * | 9/1992 | Suzuki | 438/365 |
| 5,204,276 A | * | 4/1993 | Nakajima et al. | 438/366 |
| 5,296,391 A | * | 3/1994 | Sato et al. | 438/489 |
| 5,494,836 A | * | 2/1996 | Imai | 438/365 |
| 5,508,213 A | * | 4/1996 | Vanderwel et al. | 438/367 |
| 5,523,245 A | * | 6/1996 | Imai | 438/366 |
| 5,599,723 A | * | 2/1997 | Sato | 438/364 |
| 5,620,908 A | * | 4/1997 | Inoh et al. | 438/365 |
| 5,723,378 A | * | 3/1998 | Sato | 438/365 |

* cited by examiner

MANUFACTURE OF A SEMICONDUCTOR DEVICE WITH AN EPITAXIAL SEMICONDUCTOR ZONE

BACKGROUND OF THE INVENTION

The invention relates to a method of manufacturing a semiconductor device with an epitaxial semiconductor zone, whereby a first layer of insulating material, a first layer of non-monocrystalline silicon, and a second layer of insulating material are provided in that order on a surface of a silicon wafer, a window with a steep wall is etched through the second layer of insulating material and the first layer of non-monocrystalline silicon, so that the first layer of insulating material becomes exposed, the wall of the window is provided with a protective layer,—the first insulating layer is selectively etched away within the window and below an edge of the first layer of non-monocrystalline silicon adjoining the window such that both the edge of the first layer of non-monocrystalline silicon itself and the surface of the wafer become exposed within the window and below said edge, semiconductor material is selectively deposited such that the epitaxial semiconductor zone is formed on the exposed surface of the wafer, and an edge of polycrystalline semiconductor material connected to the epitaxial semiconductor zone is formed on the exposed edge of the first layer of non-monocrystalline silicon, an insulating spacer layer is provided on the proctective layer on the wall of the window, and a second layer of non-monocrystalline silicon is deposited.

The semiconductor device may be a bipolar transistor here while the epitaxial semiconductor zone forms the base of the transistor. The emitter of the transistor is then formed through diffusion from the second layer of non-monocrystalline silicon. The base is contacted through the first non-monocrystalline layer of silicon, the emitter through the second non-monocrystalline layer of silicon. The semiconductor device may alternatively be a MOS transistor. The MOS transistor is then formed in the epitaxial semiconductor zone. In that case, a gate oxide layer is formed on the epitaxial zone before the second layer of non-monocrystalline silicon is deposited. A pattern of conductors, from which the source and drain zones are diffused into the epitaxial zone, is then formed in the first layer of non-monocrystalline silicon before the first layer of insulating material is deposited. The source and drain are contacted by the conductors formed in the first layer of non-monocrystalline silicon. The second layer of non-monocrystalline silicon here forms the gate electrode of the MOS transistor.

It is of major importance, both in the manufacture of the bipolar transistor and in the manufacture of the MOS transistor, that during the selective deposition no semiconductor material should be deposited on the protective layer provided on the edge of the window. A layer deposited there would cause a short-circuit from the emitter to the base or from the source to the drain, as the case may be.

EP-A-0 535 350 discloses a method of the kind mentioned in the opening paragraph whereby the first layer of insulating material comprises silicon oxide, the second layer of insulating material silicon nitride, and the protective layer provided on the window wall silicon nitride. $Si_{1-x}Ge_x$ is selectively deposited as the semiconductor material, x being greater than 0.2 and smaller than 0.4.

In practice, one or several silicon wafers are heated in a reaction chamber while a mixture of gases is conducted over the wafers in the selective deposition of semiconductor material. The deposition process is monitored by means of test data obtained in that a layer is deposited on a bare test wafer of silicon. During deposition, this test wafer is covered over its entire surface with a layer of semiconductor material. When the method is carried out, however, wafers positioned in the reaction chamber are not covered over their entire surfaces with semiconductor material during the deposition, but only on the silicon exposed within the windows present on the wafer, not on the protective layer on the window walls and not on the second layer of insulating material. The deposition process progresses completely differently within the comparatively small windows than on the test wafer which is covered with semiconductor material over its entire surface. The test data obtained from the test wafer are therefore not representative of the deposition in the windows. Since it cannot be directly measured how the process progresses within the comparatively small windows, moreover, it is very difficult to monitor the selective deposition process during the formation of the epitaxial semiconductor zone.

SUMMARY OF THE INVENTION

The invention has for its object inter alia to improve the method mentioned in the opening paragraph such that the selective deposition process during the formation of the epitaxial semiconductor zone can be monitored in a simple manner.

According to the invention, the method is for this purpose characterized in that, before the selective deposition of the semiconductor material, a top layer is provided on the second layer of insulating material, which top layer is made of a material on which non-monocrystailine semiconductor material will grow during the selective deposition of the semiconductor material.

Not only the silicon exposed within the windows present on the wafer is now covered with semiconductor material, but also the top layer provided on the second layer of insulating material on the wafers present in the reaction chamber. It is only the walls of the windows coated with the protective layer which are not provided with semiconductor material. This means that the wafers are substantially entirely covered with semiconductor material. It is found in practice that in that case the deposition can indeed be monitored by means of the test data obtained from the test wafer. It is found that a monocrystalline layer is deposited on the test wafer as quickly and to the same thickness as on the silicon exposed within the windows. It is surprisingly found that the fact that a non-monocrystalline semiconductor material is formed on the top layer instead of a monocrystalline one plays no part here.

Preferably, a top layer of non-monocrystalline silicon is provided on the second layer of insulating material. A layer of non-monocrystalline semiconductor material is then deposited thereon during the deposition of semiconductor material. After the formation of the epitaxial semiconductor zone and after the provision of the insulating spacer layer on the wall of the window, the second layer of non-monocrystalline silicon is then deposited. A connection conductor for the emitter zone is formed therein in the case of a bipolar transistor, whereas the gate electrode is formed here in the case of a MOS transistor. The same pattern may then be simply etched into the top layer of non-monocrystalline silicon, into the layer of non-monocrystalline semiconductor material deposited on the top layer, and into the second layer of non-monocrystalline silicon for the formation of the connection conductor or gate electrode. Said pattern can be etched in one and the same plasma when the semiconductor material is silicon or $Si_{1-x}Ge_x$ with 0.1<x <0.4.

The top layer is formed on the second layer of insulating material in a simple manner when the top layer is already provided on the second layer of insulating material before etching of the window, and the window is etched also through the top layer.

BRIEF DESCRIPTION OF THE DRAWINGS

The invention will be explained in more detail below by way of example with reference to a drawing, in which.

DETAILED DESCRIPTION OF THE PREFERRED EMBODIMENTS

Figure 1:
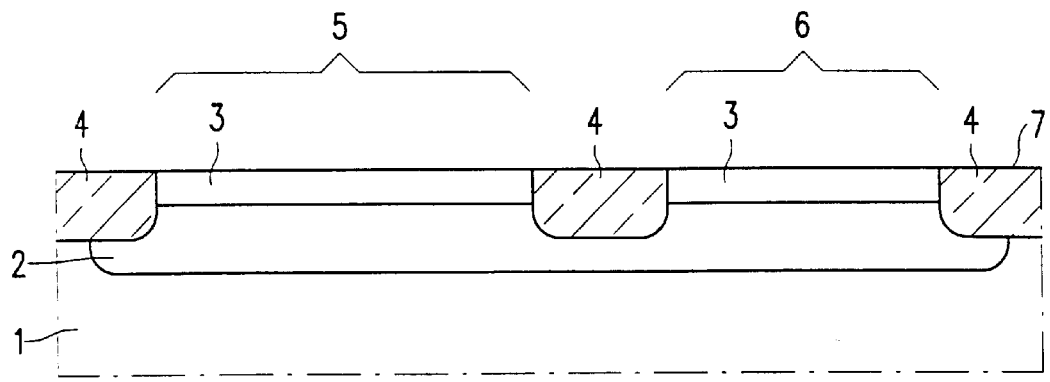
FIGS. 1 to 6 diagrammatically and in cross-section show a few stages in the manufacture of a bipolar transistor with an epitaxial base manufactured by a method according to the invention, and FIGS. 7 to 9 diagrammatically and in cross-section show a few stages in the manufacture of a MOS transistor with an epitaxial channel zone manufactured by a method according to the invention.
Figure 2:
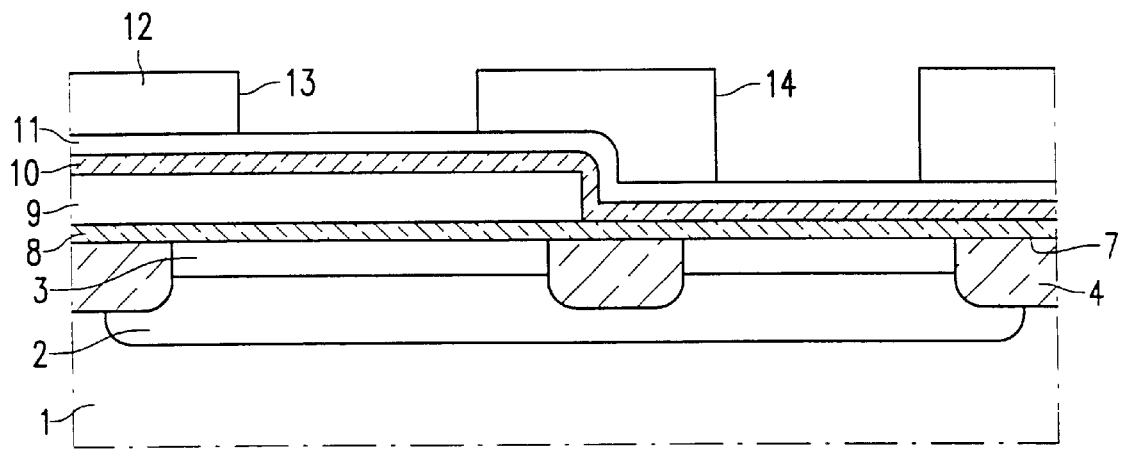
Figure 3:
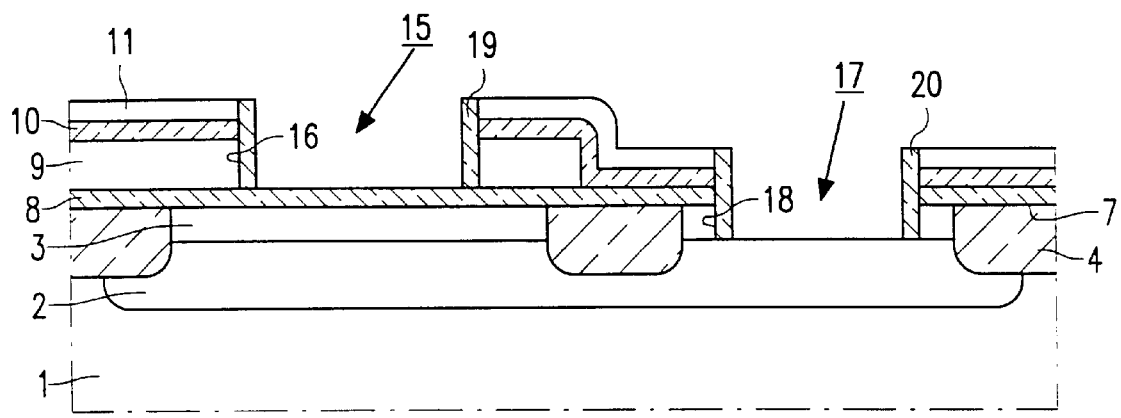
Figure 4:
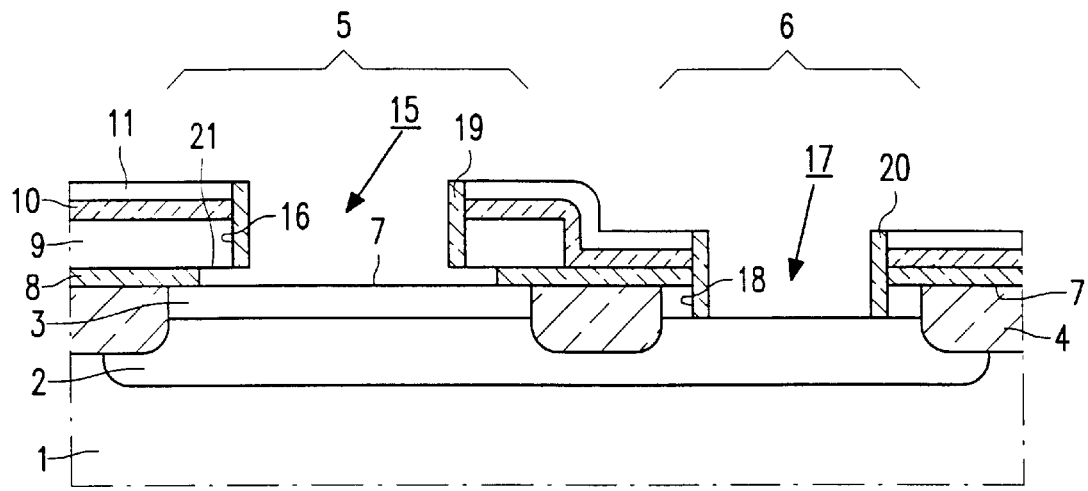
Figure 5:
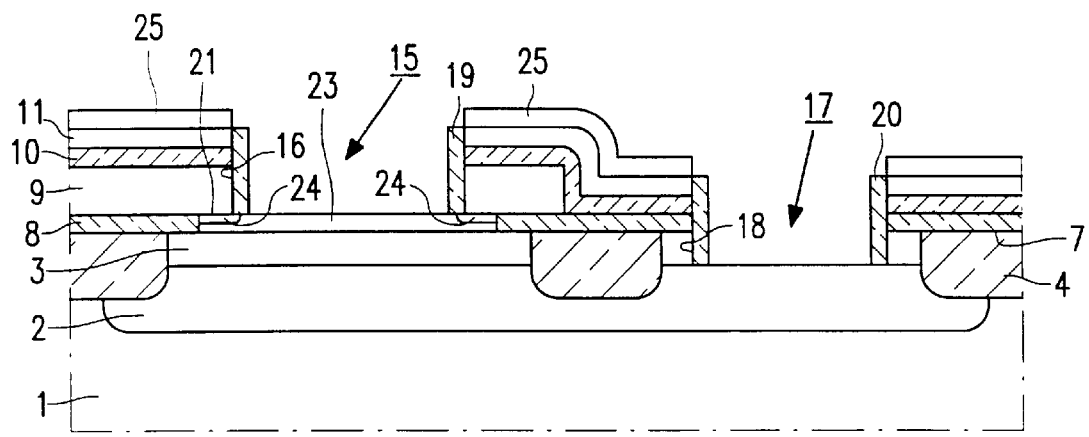
Figure 6:
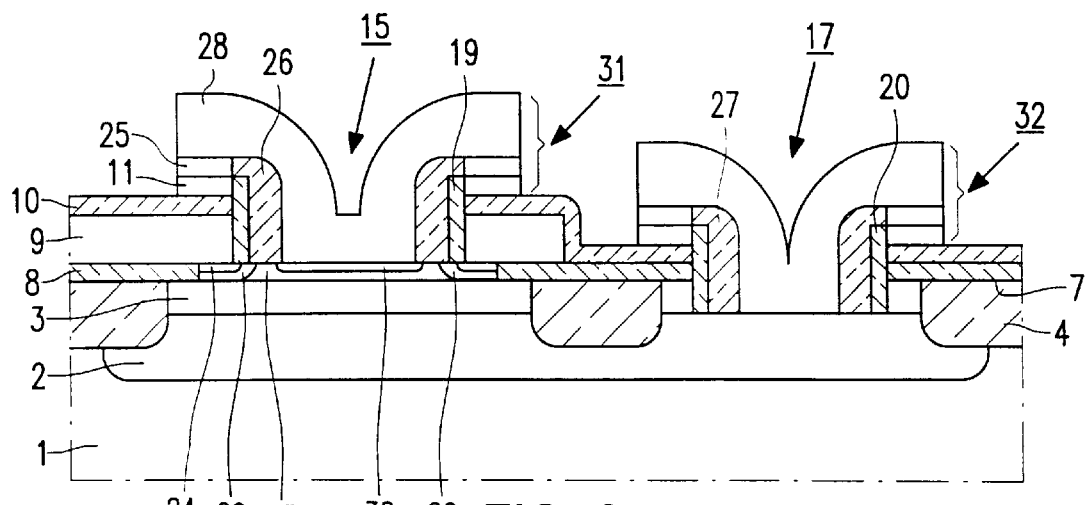

The manufacture of a bipolar transistor with epitaxial base as shown in FIGS. 1 to 6 starts with a silicon wafer 1 with a buried $n^+$-type layer 2 and an n-type epitaxially formed layer 3 in which field oxide 4 is formed in a usual manner, for example through local oxidation of silicon. Two regions 5 and 6 are surrounded by the field oxide 4. The transistor will be formed in region 5, and the buried layer 2 will be contacted in region 6. The epitaxial layer 3 in region 5 forms the collector zone of the transistor.

A first layer of insulating material 8, a first layer of non-monocrystalline silicon 9, and a second layer of insulating material 10 are provided in that order on the surface 7 of the silicon wafer 1. The first layer of insulating material 8 here is an approximately 150 nm thick silicon oxide layer, the layer of non-monocrystalline silicon 9 an approximately 300 nm thick $p^+$-type layer of polycrystalline silicon, and the second layer of insulating material 10 an approximately 150 nm thick layer of silicon nitride. A top layer 11 of polycrystalline silicon to be further discussed below is provided on the second layer of insulating material 10.

Before the layer 10 and 11 are provided, the layer of non-monocrystalline silicon 9 is etched into a pattern. The layer of non-monocrystalline silicon 9 is present above the region 5, but not above the region 6. An etching mask 12 is formed on the top layer 11 in usual manner and provided with a window 13 at the area where the epitaxial base will be formed in region 5 and with a window 14 at the area where the buried layer 2 will be contacted in the region 6. The etching mask 12 may be a photoresist mask, or alternatively a hard mask of, for example, silicon oxide.

A window 15 with a steep wall 16 is etched through the top layer 11, through the second layer of insulating material 10, and through the first layer of non-monocrystalline silicon 9 at the area of the region 5 by means of a usual anisotropic plasma etching treatment. A window 17, also having a steep wall 18, is etched through the top layer 11, the second layer of insulating material 10, the first layer of insulating material 8, and the epitaxial layer 3 at the area of region 6. The wall 16 of the window 15 is subsequently given a protective layer 19, and the wall 18 of the window 17 a protective layer 20. In this example, an approximately 50 nm thick layer of silicon nitride is deposited for this purpose and is subsequently subjected to an anisotropic plasma etching treatment until the layer has been removed again except from the walls 16 and 18.

In a subsequent usual isotropic etching treatment, the first insulating layer 8 is selectively etched away within the window 15 and below an edge 21 of the first layer of non-monocrystalline silicon 9 adjoining the window, both the edge 21 of the first layer of non-monocrystalline silicon itself and the surface 7 of the wafer within the window 15 and below the edge 21 becoming exposed thereby.

Subsequently, semiconductor material is selectively deposited in that, after cleaning in an atmosphere of pure hydrogen at a temperature of 925° C., a gas mixture comprising 20 l hydrogen, 20 cc dichlorosilane, and 7 cc hydrochloric acid is conducted over the wafer, which is heated to 700° C., at a pressure of approximately 20 torr. Silicon is selectively deposited in this manner. If an additional 0.2 cc germanium is added to the above gas mixture, $Si_{1-x}Ge_x$ with x=0.1 is selectively deposited. The epitaxial base zone 23 is formed on the exposed surface 7 of the wafer 1 within the window 15, and an edge of polycrystalline semiconductor material 24 connected to the epitaxial base zone 23 is formed on the exposed edge 21 of the first layer of non-monocrystalline silicon 9. A polycrystalline layer 25 of the semiconductor material is deposited on the top layer of polycrystalline silicon. The semiconductor material deposited in the window 17 is removed. Since the deposition of semiconductor material proceeds selectively, no semiconductor material is deposited on the protective layers 19 and 20 of the windows 15 and 16.

Insulating spacer layers 26 and 27 are provided on the protective layers 19 and 20 on the walls 16 and 18 of the windows 15 and 17. In this example, an approximately 100 nm thick layer of silicon oxide is deposited for this purpose and is subsequently subjected to an anisotropic plasma etching treatment until only the spacer layers 26 and 27 remain. Finally, a second layer of non-monocrystalline silicon 28 is deposited, in this example a layer of $n^+$-type polycrystalline silicon. A base contact zone 29 is formed through diffusion from the first layer of non-monocrystalline silicon 9, and the emitter zone 30 is formed from the second layer of non-monocrystalline silicon 28. Finally, a pattern of conductors 31 and 32 is etched into the layer 28, the layer 25, and the layer 11. Conductor 31 contacts the emitter zone 30, conductor 32 the buried layer 2 and thus the collector zone of the transistor. The layer 9 contacts the base zone 23 via zones 24 and 29.

Figure 7:
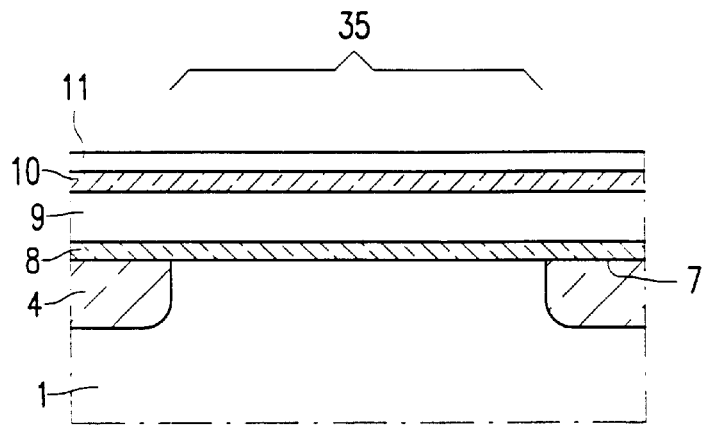
Figure 8:
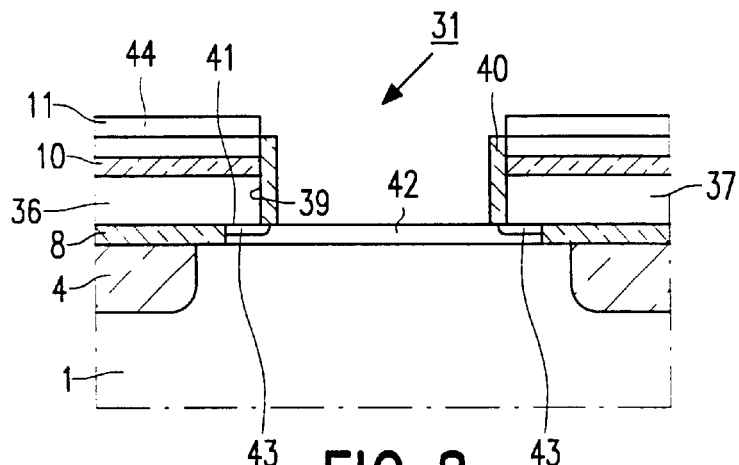
Figure 9:
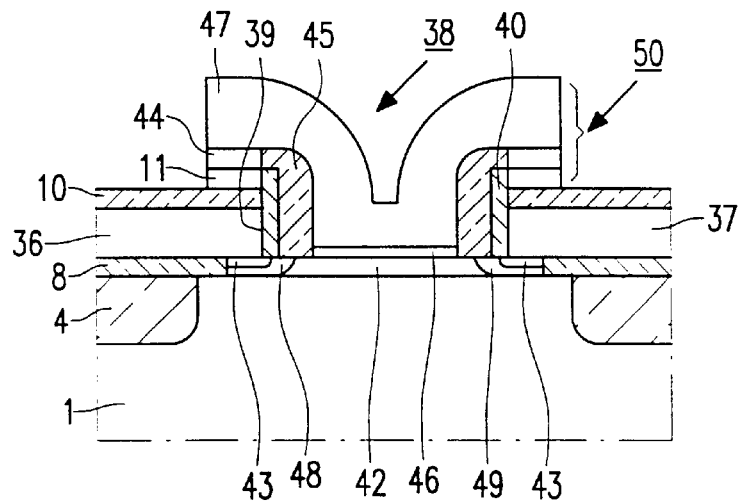

The manufacture of a MOS transistor with epitaxial gate zone as shown in FIGS. 7 to 9 starts with a silicon wafer 1 in which field oxide 4 is formed in usual manner, for example through local oxidation of silicon. A rectangular region 35, in which the MOS transistor will be formed, is surrounded by the field oxide 4. Corresponding parts in FIGS. 7 to 9 have been given the same reference numerals as in FIGS. 1 to 6.

A first layer of insulating material 8, a first layer of non-monocrystalline silicon 9, and a second layer of insulating material 10 are again provided here in that order on the surface 7 of the silicon wafer 1. The first layer of insulating material 8 in this case is an approximately 50 nm thick layer of silicon oxide, the layer of non-monocrystalline silicon 9 an approximately 100 nm thick layer of n⁺-type polycrystalline silicon, and the second layer of insulating material 10 an approximately 50 nm thick layer of silicon nitride. A top layer 11 of polycrystalline silicon yet to be discussed below is provided on the second layer of insulating material 10.

The layer of non-monocrystalline silicon 9 is etched into a pattern before the layers 10 and 11 are provided. For the MOS transistor, two conductor tracks 36 and 37 are etched in this layer 9. The region in the example has a width of 1.2 $\mu$m, seen transversely to the plane of drawing, while each conductor track 36, 37 has a width of 1 $\mu$m. The other layers 8, 10, 11 do cover the entire surface 7 of the wafer 1.

A window 38 with a steep wall 39 is etched through the top layer 11, the second layer of insulating material 10, and the first layer of non-monocrystalline silicon 9 at the area of the region 35 by means of a usual anisotropic plasma etching treatment. The wall 39 is subsequently given an approximately 200 nm thick protective layer 40 provided with silicon nitride, as in the previous example.

In a next usual isotropic etching treatment, the first insulating layer 8 is selectively etched away within the window 38 and below an edge 41 of the first layer of non-monocrystalline silicon 9 adjoining the window, both the edge 41 of the first layer of non-monocrystalline silicon itself and the surface 7 of the wafer within the window 38 and below the edge 41 becoming exposed thereby.

Semiconductor material is subsequently selectively deposited, as in the preceding example. The epitaxial gate zone 42 is formed on the exposed surface 7 of the wafer 1 within the window 38, and an edge of polycrystalline semiconductor material 43 connected to the epitaxial gate zone 42 is formed on the exposed edge 41 of the first layer of non-monocrystalline silicon 9. A polycrystalline layer 44 of the semiconductor material is deposited on the top layer of polycrystalline silicon. No semiconductor material is deposited on the protective layer 40 because the deposition of semiconductor material proceeds selectively.

As in the preceding example, an approximately 200 nm thick insulating spacer layer 45 of silicon oxide is provided on the protective layers 40. Then the epitaxial gate zone 42 is given a gate oxide layer 46 in a usual manner through oxidation. Finally, a second layer of non-monocrystalline silicon 47 is deposited, in this example a layer of n⁺-type polycrystailine silicon. A source connection zone 48 and a drain connection zone 49 are formed through diffusion from the first layer of non-monocrystalline silicon 9. Finally, a gate electrode 50 is etched into the layer 47, the layer 44 and the layer 11. The conductor 36 contacts the source connection zone 48 via zone 43, the conductor 37 contacts the drain connection zone 49 via zone 43.

In the examples described, a top layer 11 of a material on which non-monocrystalline semiconductor material will grow during the selective deposition of the semiconductor material is provided on the second layer of insulating material 10 before the selective deposition of the semiconductor material whereby the epitaxial base zone 23 and the epitaxial gate zone 42 are formed.

A number of silicon wafers is heated in a reaction chamber while a mixture of gases is conducted over the wafers during the selective deposition of semiconductor material. A bare test wafer of silicon is also placed in the reactor chamber during this. This test wafer is covered with a layer of semiconductor material over its entire surface during the deposition. The deposition process can be monitored with the aid of data measured during the deposition of the semiconductor material on the test wafer.

In the examples described, not only the silicon exposed within the windows 15, 17, 38 present on the wafer is covered with semiconductor material, but also the top layer 11 provided on the second layer of insulating material 10 on the wafers present in the reaction chamber. It is only the walls 16, 18, 39 of the windows 15, 17, 38 covered with the protective layers 19, 20, 40 which are not given a deposit of semiconductor material. This means that the wafers are practically entirely covered with semiconductor material. It is found in practice that the deposition can then be satisfactorily monitored by means of the data obtained from the test wafer. It is found that a monocrystalline layer is deposited on the test wafer now as quickly and to the same thickness as on the silicon exposed within the windows.

Without the top layer 11, the other wafers arranged in the reaction chamber would not be covered with semiconductor material over their entire surfaces during the deposition but only on the silicon exposed within the windows 15, 17, 38 present on the wafer. The deposition process, however, progresses in an entirely different manner within the comparatively small windows compared with the test wafer which is covered with semiconductor material over its entire surface. The test data obtained from the test wafer are accordingly not representative of the deposition in the windows on the other wafers. Since it cannot be directly measured how the process progresses within the comparatively small windows, moreover, it is very difficult to monitor the selective deposition process during the formation of the epitaxial semiconductor zone. It is surprisingly found that the fact that a layer of non-monocrystalline semiconductor material is formed on the top layer 11 instead of a layer of monocrystalline material plays no part here.

Preferably, a top layer 11 of non-monocrystalline silicon is provided on the second layer of insulating material 10. A layer of non-monocrystalline semiconductor material 25, 44 is deposited thereon during the deposition of semiconductor material. After the formation of the epitaxial semiconductor zone 23, 42 and after the provision of the insulating spacer layer 26, 45 on the wall of the window 15, 17, 38, the second layer of non-monocrystalline silicon 28, 47 is deposited. A connection conductor 31 for the emitter zone 30 is formed therein in the manufacture of a bipolar transistor, whereas the gate electrode 50 is formed therein in the manufacture of a MOS transistor. The same pattern can then be simply etched into the top layer of non-monocrystalline silicon 11, into the layer of non-monocrystalline semiconductor material 25, 44 deposited on the top layer, and into the second layer of non-monocrystalline silicon 28, 47 for the formation of the connection conductor 31 or the gate electrode 50. Said pattern can be etched in one and the same plasma comprising chlorine if the semiconductor material is silicon or $Si_{1-x}Ge_x$ with $0.1 < x < 0.4$.

The top layer 11 in the examples described is formed on the second layer of insulating material 10 in a simple manner in that the top layer 11 is already provided on the second layer of insulating material 10 before etching of the window 15, 17, 38 and in that the window 15, 17, 38 is etched also through this top layer 11.

What is claimed is:

1. A method of manufacturing a semiconductor device with an epitaxial semiconductor zone, whereby
   a first layer of insulating material, a first layer of non-monocrystalline silicon, and a second layer of insulating material are provided in that order on a surface of a silicon wafer,
   a top layer is provided on the second layer of insulating material, a window with a steep wall is etched through the top layer of non-monocrystalline silicon, the second layer of insulating material and the first layer of non-monocrystalline silicon, so that the first layer of insulating material becomes exposed, the wall of the window is provided with a protective layer, the first insulating layer is selectively etched away within the window and below an edge of the first layer of non-monocrystalline silicon adjoining the window such that both the edge of the first layer of non-monocrystalline silicon and the surface of the wafer become exposed within the window and below said edge, semiconductor material is selectively deposited such that the epitaxial semiconductor zone is formed on the exposed surface of the wafer, and an edge of polycrystalline semiconductor material connected to the epitaxial semiconductor zone is formed on the exposed edge of the first layer of non-monocrystalline silicon, wherein the semiconductor material is also selectively deposited on the top layer, an insulating spacer layer is provided on the protective layer on the wall of the window, and a second layer of non-monocrystalline silicon is deposited in the window.

* * * * *

UNITED STATES PATENT AND TRADEMARK OFFICE
CERTIFICATE OF CORRECTION

PATENT NO.      : 6,368,946 B1                                Page 1 of 1
DATED           : April 9, 2002
INVENTOR(S)     : Ronald Dekker et al.

It is certified that error appears in the above-identified patent and that said Letters Patent is hereby corrected as shown below:

<u>Title page,</u>
Item [73], Assignee, change "Phillips" to -- Philips --.

Signed and Sealed this

Twenty-third Day of September, 2003

JAMES E. ROGAN
*Director of the United States Patent and Trademark Office*